(12) United States Patent
Huang (10) Patent No.: US 6,686,783 B1
(45) Date of Patent: Feb. 3, 2004

(54) POWER-ON RESET SYSTEM

(75) Inventor: Yuhong Huang, Mountain View, CA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/281,483

(22) Filed: Oct. 28, 2002

(51) Int. Cl.[7] .............................................. H03K 17/22
(52) U.S. Cl. ..................................... 327/143; 327/198
(58) Field of Search .................................. 327/143, 198

(56) References Cited

U.S. PATENT DOCUMENTS

| | | | | |
|---|---|---|---|---|
| 4,142,118 A | * | 2/1979 | Guritz ......................... | 327/143 |
| 4,902,910 A | * | 2/1990 | Hsieh ......................... | 327/143 |
| 5,144,159 A | * | 9/1992 | Frisch et al. ................. | 327/198 |
| 5,187,389 A | | 2/1993 | Hall et al. ................... | 327/143 |
| 5,469,099 A | * | 11/1995 | Konishi ....................... | 327/198 |
| 5,534,804 A | | 7/1996 | Woo ........................... | 327/143 |
| 6,239,630 B1 | | 5/2001 | Bowers et al. ................ | 327/143 |
| 6,252,442 B1 | * | 6/2001 | Malherbe ..................... | 327/143 |
| 6,437,614 B1 | * | 8/2002 | Chen .......................... | 327/143 |
| 6,492,850 B2 | * | 12/2002 | Kato et al. ................... | 327/143 |

OTHER PUBLICATIONS

Analog Devices, *Power Supply and Watchdog Timer Monitoring Circuit*, ADM9690, p. 1–6, (2000).
Analog Devices, *Open–Drain Microprocessor supervisory circuit in 4–Lead SOT–143*, ADM6315, p. 1–8, (2001).

* cited by examiner

Primary Examiner—Timothy P. Callahan
Assistant Examiner—Terry L. Englund
(74) Attorney, Agent, or Firm—Koppel, Jacobs, Patrick & Heybl (57) ABSTRACT

A power-on reset system insensitive to the ramp up rate of supply voltage VDD includes two power-on reset circuits. The first reset circuit asserts a reset signal RS1 when supply voltage VDD ramps up to its rated voltage. The second reset circuit produces a first reference voltage VR1 and a second reference voltage VR2 which is delayed with respect to VR1, and asserts a reset signal RS2 when VR1 is greater than VR2. A logic gate asserts a reset signal RS3 when either RS1 or RS2 is asserted; RS3 is the output of the power-on reset system, and is asserted whether one or both of reset signals RS1 and RS2 is asserted. Both reset circuits are preferably arranged to operate with supply voltages of 2 volts or less.

13 Claims, 5 Drawing Sheets

POWER-ON RESET SYSTEM

BACKGROUND OF THE INVENTION

1. Field of the Invention

This invention relates to the field of power-on reset circuits, and particularly to power-on reset circuits for use in systems operated with a low supply voltage.

2. Description of the Related Art

Figure 1A:
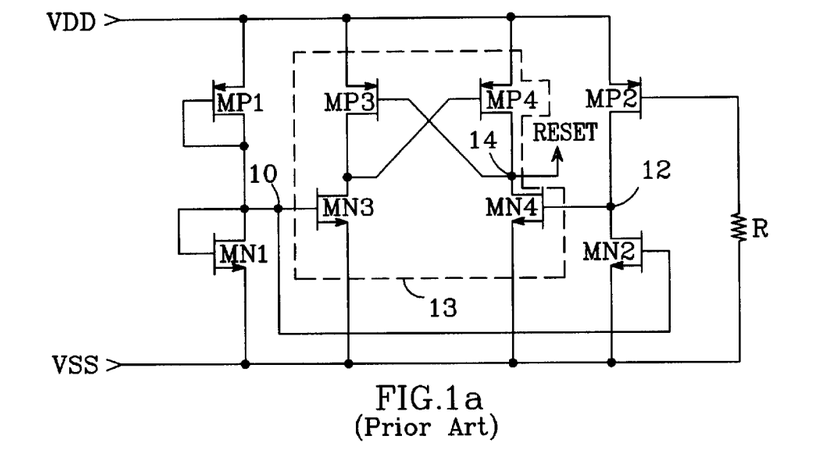
FIG. 1a is a schematic diagram of a known power-on reset circuit.
Figure 1B:
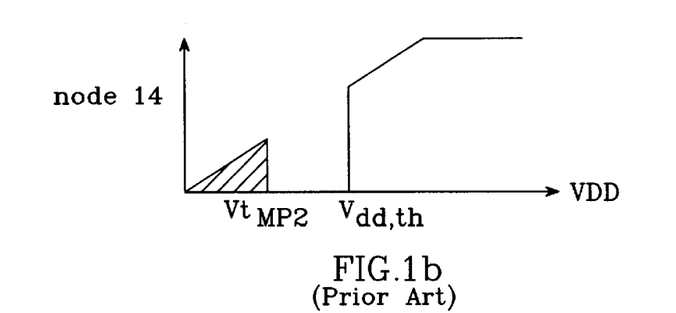
FIG. 1b is a graph illustrating the operation of the known power-on reset circuit shown in FIG. 1b.

Power-on reset circuits are well-known. Such circuits assert a reset signal, typically by toggling a digital logic signal, when a power supply voltage ramps to its rated voltage from an off state. A conventional field-effect transistor (FET) power-on reset circuit is shown in FIG. 1a. A pair of transistors MP1 and MN1 are connected between supply voltages VDD and VSS at a node 10, and a pair of transistors MP2 and MN2 are connected between the supply voltages at a node 12. A latch 13 is also connected between VDD and VSS, formed from cross-coupled FETs MP3/MN3 and MP4/MN4; the latch is controlled by the voltages applied to the gates of MN3 and MN4, which are connected to nodes 10 and 12, respectively. The output (RESET) of the circuit is taken at latch node 14. When supply voltage VDD is less than the threshold voltage of MP2 ($Vt_{MP2}$), the status of node 14 is undetermined. When VDD becomes higher than $Vt_{MP2}$, MP2 is turned on, but MN2 is still off. Node 12 is pulled up to the supply (VDD), which turns on MN4 and pulls down output node 14. An active low reset signal is generated at node 14. When VDD further increases such that it is greater than $Vt_{MP1}+Vt_{MN1}$, node 10 is pulled up enough to turn on MN2 and MN3. Since MN2 is much stronger than MP2, node 12 is pulled down to VSS. The latch changes state so that the output at node 14 goes to VDD, i.e. the reset signal becomes inactive. The threshold voltage at which this occurs is referred to herein as $V_{dd,th}$. Operation of this circuit is illustrated in FIG. 1b, which plots the voltage at node 14 with respect to increasing VDD.

Unfortunately, the circuit shown in FIG. 1a encounters problems when the steady-state supply voltage is low (e.g., <2.4 volts), as is increasingly common. Because the threshold voltage of a MOS transistor can vary as much as ±0.2 volts with process and ±0.2 volts with temperature, the $V_{dd,th}$ voltage, which is the sum of two MOS threshold voltages, can vary as much as ±0.8 volts. For example the $V_{dd,th}$ can range from 0.8 volts to 2.4 volts using the above power on reset circuit, setting the minimum supply voltage to 2.4 volts.

Figure 2A:
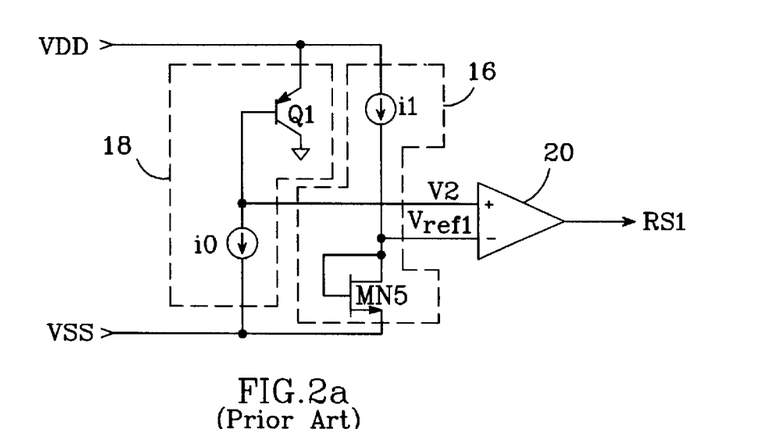
FIG. 2a is a schematic diagram of another known power-on reset circuit.

One possible example of a power-on reset circuit which could be employed with a low supply voltage is shown in FIG. 2a. The circuit comprises a reference voltage generator 16 which produces a reference voltage $V_{ref1}$ as VDD ramps up from zero volts to its rated voltage, and a voltage generator 18 which produces a voltage V2 that tracks the supply voltage. Here, V2=VDD−V1, where V1 is the voltage drop $V_{be}$ across a p-n junction. Reference generator 16 comprises a diode connected NMOS transistor MN5 biased by a current source i1, such that $V_{ref1}$ is the gate-to-source voltage ($V_{gs}$) of an NMOS FET. A comparator 20 asserts a first reset signal RS1 when $V_{ref1}$ is greater than V2, and deactivates RS1 when $V_{ref1}$ is less than V2. By having V2 vary little with process and $V_{ref1}$ compensate for changes in V2 over temperature, the threshold voltage $V_{dd,th}$ at which RS1 is deactivated can be controlled to ±0.2 volts of a target value with standard process variation and a wide temperature range (e.g. −40° C. to 125° C.). When properly arranged, the power-on reset circuit shown in FIG. 2a can operate with supply voltages of less than 2 volts.

Figure 2B:
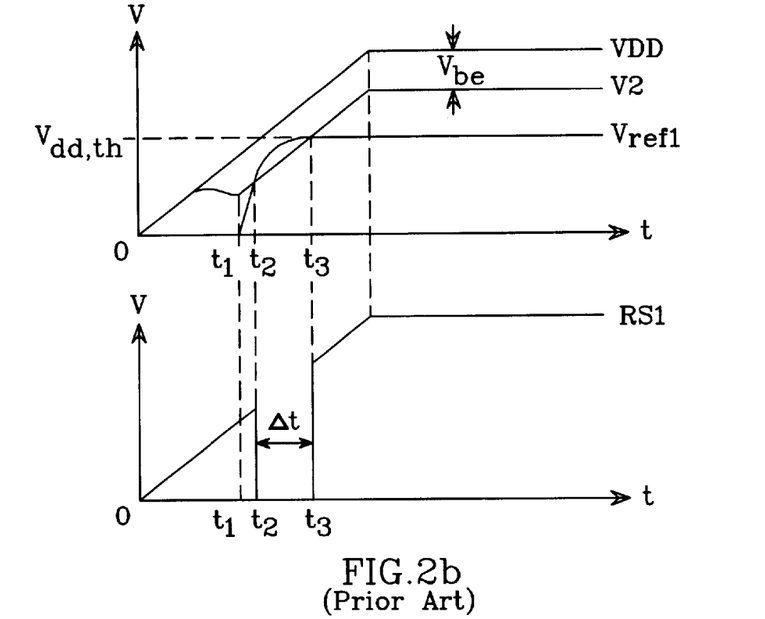
Figure 2C:
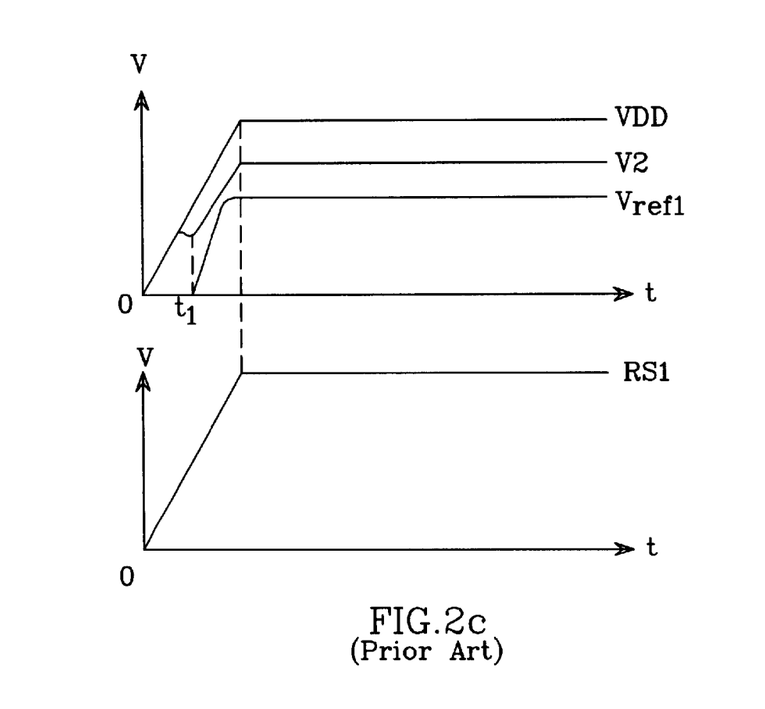

Unfortunately, the circuit shown in FIG. 2a works well when the time ("tr") required for VDD to ramp up is such that there is a period during the ramp up when $V_{ref1}$>V2. However, when tr is too short, e.g., tr<1 ms, V2 may remain greater than $V_{ref1}$ throughout the ramp-up time; when this happens, RS1 is not asserted. This is illustrated in FIGS. 2b and 2c. In FIG. 2b, VDD ramps up relatively slowly. At time $t_1$, currents i1 and i0 start up, and V2 and $V_{ref1}$ start to increase accordingly. At time $t_2$, $V_{ref1}$ becomes greater than V2, and RS1 is asserted. Then, at time $t_3$, V2 becomes greater than $V_{ref1}$ and RS1 is de-asserted. In this way, an active-low reset signal is generated, having a duration given by $\Delta t=t_3-t_2$.

There are two ways in which RS1 can fail. If Δt is too short, comparator 20 may not have a chance to work and RS1 will not be asserted. The second failure mechanism is illustrated in FIG. 2c. Here, VDD ramps up so quickly that $V_{ref1}$ never becomes greater than V2 during the ramp up time. As such, RS1 is never asserted.

SUMMARY OF THE INVENTION

A power-on reset system is presented which overcomes the problems noted above. The present system is insensitive to the rate at which the power supply is ramped up. In addition, the power-on reset system preferably has a more precise $V_{dd,th}$ than the prior art, such that it operates reliably at a low supply voltage.

The present system includes two power-on reset circuits. The first reset circuit normally asserts a first reset signal RS1 as VDD ramps up from zero volts to its rated voltage, as long as ramp up time tr is sufficiently long. The first reset circuit sets the threshold, $V_{dd,th}$, for the power-on-reset system.

The second power on reset circuit is designed to assert a second reset signal RS2 when the power-on ramp up time is short. The circuit comprises a first reference voltage generator which produces a reference voltage VR1 as VDD ramps up from zero volts to its rated voltage, and a second reference voltage generator which produces a reference voltage VR2 that is delayed with respect to VR1 and is higher than VR1 when VDD is at its rated voltage. A comparator asserts the second reset signal RS2 when VR1 is temporarily greater than VR2. A logic gate receives RS1 and RS2 at respective inputs, and asserts a reset signal RS3 when either RS1 or RS2 is asserted; RS3 is the output of the power-on reset system.

When so arranged, if the first reset circuit fails to assert RS1 due to a ramp-up time which is too short, the second reset circuit asserts its reset signal RS2. Output reset signal RS3 is thus asserted regardless of the duration of the ramp-up.

With the second reset circuit to overcome the short ramp-up time problem and the first reset circuit to provide a more precise $V_{dd,th}$, the reset system can operate reliably at supply voltages of less than 2 volts.

Further features and advantages of the invention will be apparent to those skilled in the art from the following detailed description, taken together with the accompanying drawings.

BRIEF DESCRIPTION OF THE DRAWINGS

FIGS. 2b and 2c are graphs illustrating two operating modes of the power-on reset circuit shown in FIG. 2a.

DETAILED DESCRIPTION OF THE INVENTION

Figure 3:
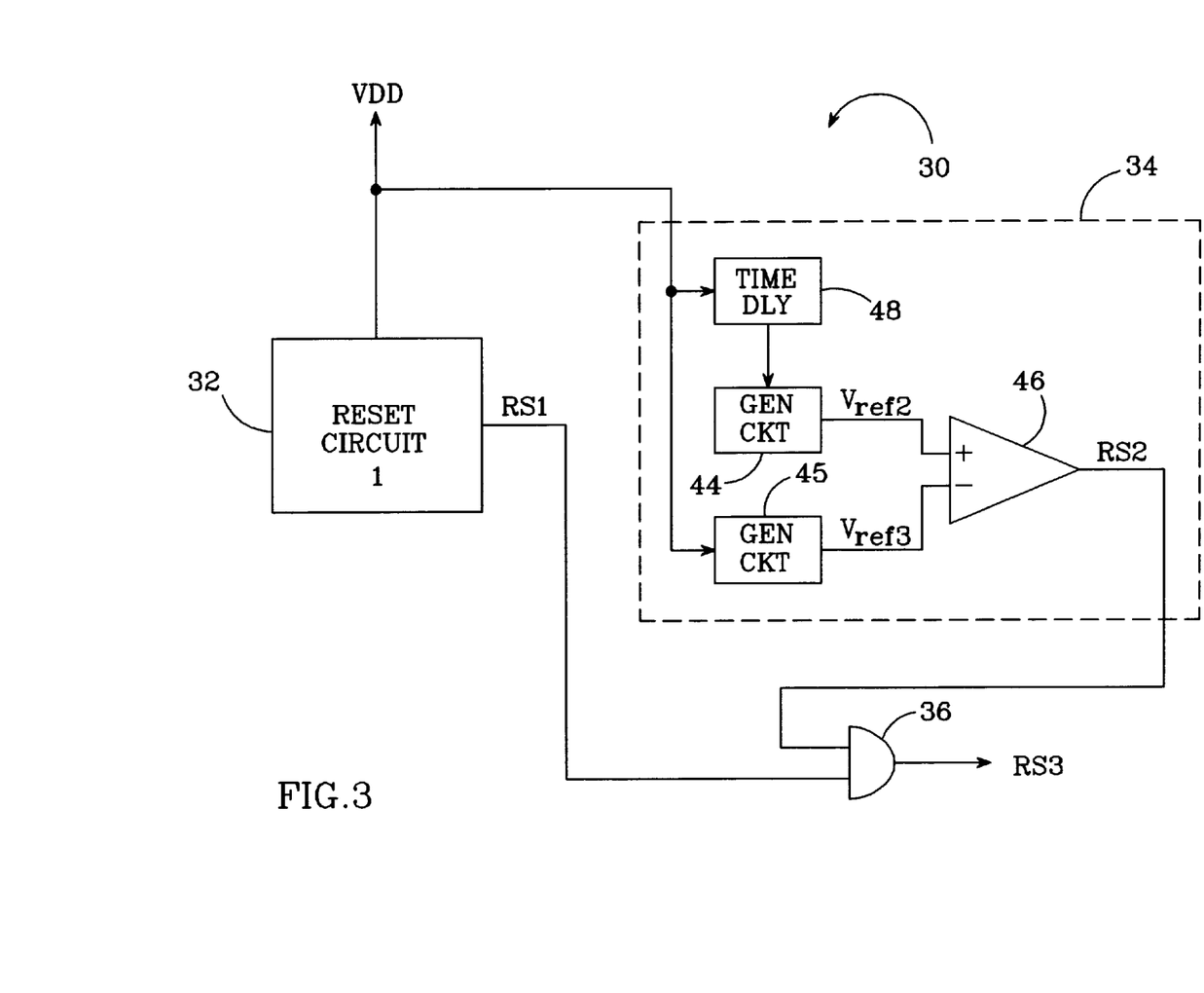
FIG. 3 is a block/schematic diagram which illustrates the basic principles of a power-on reset system per the present invention.

The basic principles of a power-on reset system 30 in accordance with the present invention are illustrated in FIG. 3. The system comprises a first power-on reset circuit 32, a second reset circuit 34, and a logic gate 36 which combines the outputs of the two reset circuits. The system is powered by a supply voltage, referred to herein as VDD, which ramps from zero volts to a rated voltage at power-on.

First reset circuit 32 is arranged such that it asserts a first reset signal RS1 as VDD ramps up from 0 volts to its rated voltage—but only as long as ramp up time tr is sufficiently long. As used herein, a reset signal is "asserted" when it is of the polarity necessary to reset the external circuitry which receives it, while VDD is ramping up. Thus, RS1 is "asserted" if it goes low or stays low while VDD is ramping up—assuming that the external circuitry requires a logic "low" to be reset.

A power-on reset circuit which fails if ramp up time tr is too short, such as first reset circuit 32, can be implemented in a number of different ways. One possible implementation of such a reset circuit is shown in FIG. 2a. As described above, reference voltage generator 16 produces a reference voltage $V_{ref1}$ as VDD ramps up from zero volts to its rated voltage, and voltage generator 18 produces a voltage V2 that tracks the supply voltage. Here, V2=VDD−V1, where V1 is the voltage drop $V_{be}$ across a p-n junction (Q1). Reference voltage generator 16 comprises a diode-connected NMOS transistor MN5 biased by a current source i1, such that $V_{ref1}$ is the gate-to-source voltage ($V_{gs}$) of an NMOS FET. $V_{ref1}$ and V2 are fed to comparator 20, the output of which is RS1. When $V_{ref1}$>V2, RS1 is asserted, while when $V_{ref1}$<V2, RS1 is inactive.

As noted above and shown in FIGS. 2b and 2c, the circuit shown in FIG. 2a works well when the time ("tr") required for VDD to ramp up is such that there is a period during the ramp up when $V_{ref1}$>V2. However, when tr is too short, e.g., tr<1 ms, V2 may remain greater than $V_{ref1}$ throughout the ramp-up time; when this happens, RS1 is not asserted.

Referring back to FIG. 3, the failure of first reset circuit 32 to assert a reset signal is overcome with the use of second reset circuit 34. Circuit 34 includes a generating circuit 44 which produces a reference voltage $V_{ref2}$, a generating circuit 45 which produces a reference voltage $V_{ref3}$, and a comparator 46 which receives $V_{ref2}$ and $V_{ref3}$ at its inputs, and which produces a second reset signal RS2 which is asserted when $V_{ref3}$>$V_{ref2}$. Second reset circuit 34 also includes a time delay circuit 48, which delays the application of VDD to generating circuit 44 such that $V_{ref2}$ is delayed with respect to $V_{ref3}$. Generating circuits 44 and 45 are arranged such that, when VDD is at its rated voltage, $V_{ref2}$>$V_{ref3}$.

In operation, as VDD ramps from zero, $V_{ref3}$ comes up first, followed by $V_{ref2}$. This results in a period during the ramp-up when $V_{ref3}$>$V_{ref2}$. During this period, the output of comparator 46 goes low (or stays low), and thus RS2 is asserted. As VDD continues to increase, $V_{ref2}$ becomes greater than $V_{ref3}$ and RS2 is de-asserted. Reset signals RS1 and RS2 are fed to logic gate 36, which is arranged to assert its output RS3 when either RS1 or RS2 is asserted. The output RS3 of gate 36 is the power-on reset system's output, which is provided to external circuitry (not shown) to perform a power-on reset function.

When so arranged, a power-on reset signal is asserted regardless of the ramp-up time of VDD. Under some conditions, reset circuits 32 and 34 both assert their reset signals RS1 and RS2, so that RS3 is asserted at least once and possibly twice. However, if reset circuit 32 fails to assert RS1 due to, for example, a tr which is too short, reset circuit 34 still asserts RS2, and RS3 toggles. The combination of the two reset signals, RS1 and RS2, ensures that a power-on reset signal is asserted regardless of tr.

In addition to being insensitive to the rate at which the power supply is ramped up, the present system can be further arranged to operate reliably at supply voltages of less than 2 volts. For example, when first reset circuit 32 is implemented as shown in FIG. 2a, $V_{ref1}$ is less than V2 until VDD ramps up to a threshold voltage, $V_{dd,th}$, when V2=$V_{ref1}$. When VDD is above $V_{dd,th}$, V2>$V_{ref1}$, and RS1 is inactive. If V2 is designed such that V2=VDD−V1, V2=$V_{ref1}$ results in $V_{dd,th}$=V1+$V_{ref1}$. To reduce the effect of temperature on $V_{dd,th}$, generating circuit 18 can be designed so that $V_{ref1}$ cancels V1 change with temperature. When implemented as shown in FIG. 2a, $V_{ref1}$ is the gate-to-source voltage ($V_{gs}$) of NMOS FET MN5, and is thus given by:

$$V_{ref1}=V_{th}+sqrt(2*Id/(mobility*Cox*W/L)).$$

$V_{be}$ is the base-emitter voltage of a diode or an pnp bipolar transistor, and $V_{th}$ is the threshold voltage of the NMOS FET. Both $V_{be}$ and $V_{th}$ decrease as temperature increases (~−2 mV/° C.). Since mobility goes down with temperature, the second term in $V_{ref1}$, sqrt (2*Id/ (mobility*Cox*W/L)), can be arranged to have a positive temperature coefficient of ~+4 mV/degC. This results in a $V_{dd,th}$ voltage which is given by:

$$V_{dd,th}=V_{be}+V_{th}+sqrt(2*Id/(mobility*Cox)).$$

Thus, when i1 is properly chosen, $V_{dd,th}$ is approximately temperature independent.

Since $V_{be}$ varies little with process, the only process variation is with respect to $V_{ref1}$, which can vary about ±0.2 volts. With the uncertainty in $V_{dd,th}$ significantly reduced in this way, it is possible to design a reset circuit 32 that operates reliably with low supply voltages on the order of VDD<2V. The same is true for the present power-on reset system since the second reset circuit 34 does not usually pose a limit on the supply voltage level (as discussed below).

Figure 4:
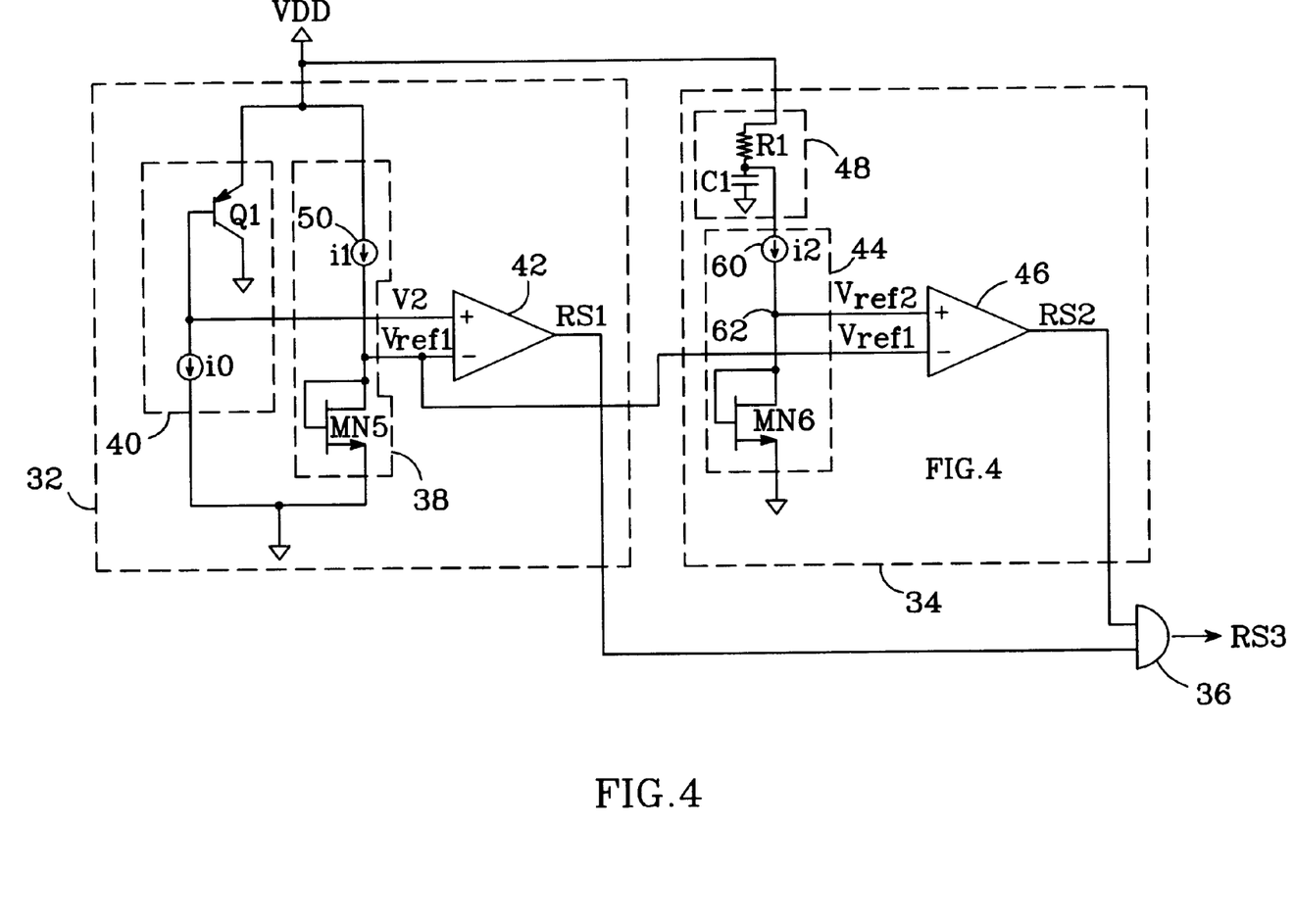
FIG. 4 is a schematic diagram of a preferred embodiment of a power-on reset system per the present invention.

A preferred embodiment of the present invention is shown in FIG. 4. First power-on reset circuit 32 is as shown in FIG. 2a. For second power-on reset circuit 34, generating circuit 44 comprises a current source 60 which is powered by VDD (via time delay circuit 48) and outputs a current i2 as VDD ramps from 0 volts to its rated voltage; a transistor MN6 is connected to conduct i2. Reference voltage $V_{ref2}$ is taken at the junction 62 of i2 and MN6.

In this embodiment, reference voltage $V_{ref1}$ from reset circuit 32 serves as the "$V_{ref3}$" input to comparator 46; as before, the reference voltages are arranged such that $V_{ref2}$>$V_{ref1}$ when VDD is at its rated voltage. Comparator 46 asserts its output RS2 when $V_{ref1}$>$V_{ref2}$. Time delay circuit 48 preferably delays the application of VDD to current source 60, such that $V_{ref2}$ is delayed with respect to $V_{ref1}$. Delay circuit 48 may be implemented in many different ways; for example, a simple RC circuit which includes a resistance R1 and a capacitance C1 might be used. As before, RS1 and RS2 are provided to logic gate 36, which asserts its output RS3 when either RS1 or RS2 is asserted.

Figure 5:
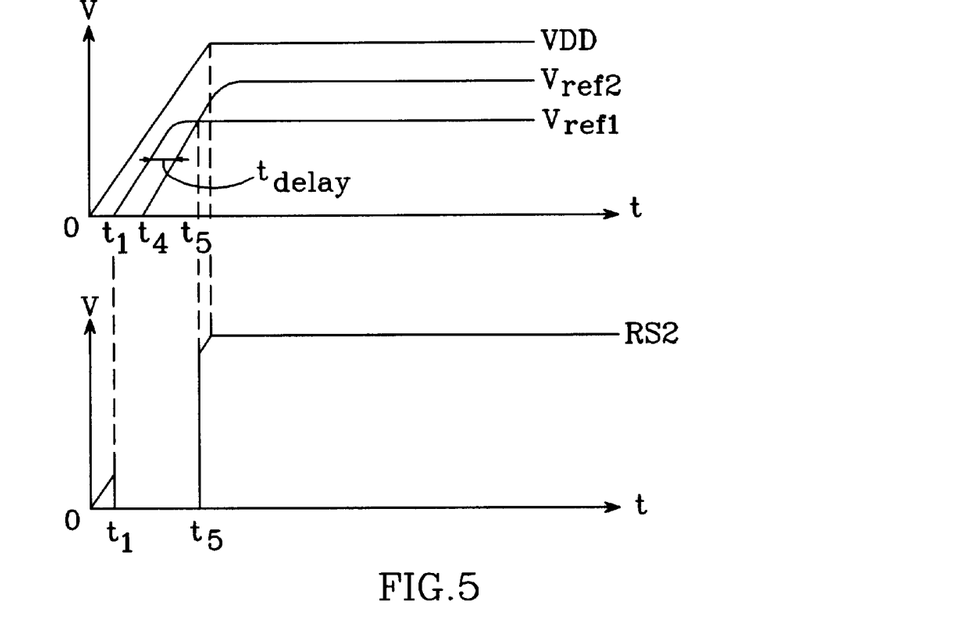
FIG. 5 is a graph illustrating the operation of one of the power-on reset circuits shown in FIG. 4.

The operation of reset circuit 34 is illustrated in the timing diagram shown in FIG. 5. VDD is seen ramping from zero to its rated voltage. At time $t_1$, current il starts up, and $V_{ref1}$ starts to increase. After a time delay $t_{delay}$ established by time delay circuit 48, current source 60 becomes active at time $t_4$, thereby generating i2 and causing $V_{ref2}$ to ramp up. $V_{ref2}$ is delayed with respect to $V_{ref1}$. As such, there is a period during the ramp-up when $V_{ref1} > V_{ref2}$. During this period, comparator 46 asserts RS2.

As noted above, the reset circuits are arranged such that, when VDD is at its rated voltage, $V_{ref2} > V_{ref1}$. When $V_{ref2}$ exceeds $V_{ref1}$, at time $t_5$, RS2 returns to a logic high (i.e., is de-asserted). The asserting of RS2 causes power-up reset system output RS3 to also be asserted. In this way, a reset signal is asserted despite the short ramp up time.

Figure 6:
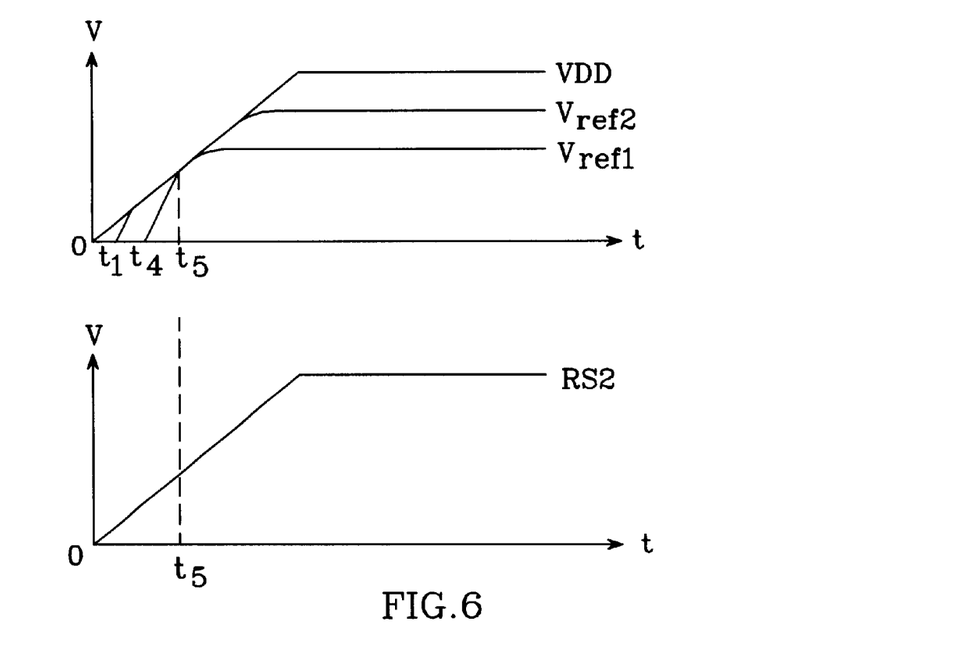
FIG. 6 is a graph illustrating another mode of operation for one of the power-on reset circuits shown in FIG. 4.

Note that, in the preferred embodiment shown in FIG. 4, second reset circuit 34 only requires that $V_{ref2} > V_{ref1}$ at the rated voltage. Therefore it usually does not pose a limit on the supply voltage and thus can work with a low supply voltage as long as the ramp-up time is fast (on the same order of the delay time from $V_{ref2}$ to $V_{ref1}$). If ramp-up time tr is too long (tr>>$t_{delay}$), $V_{ref2}$ may always be greater than $V_{ref1}$ such that reset circuit 34 fails to assert signal RS2. This possibility is shown in FIG. 6. However, in this case, reset circuit 32 will assert RS1, and RS3 will be asserted.

Note that, though it is convenient to use $V_{ref1}$ as the "$V_{ref3}$" input to comparator 46 in FIG. 4, the invention does not require that reset circuit 32 be the source for "$V_{ref3}$". An independent voltage generating circuit may also be used.

In order to ensure proper operation, the tr ranges over which reset circuits 32 and 34 operate should overlap. To facilitate this, it is preferred that $V_{ref1}$ and V2 be developed with currents generated by a first current generating circuit, and that $V_{ref2}$ be developed from a second current generating circuit, the operation of which is delayed with respect to the first current generating circuit.

Note that there is no requirement that the invention's second reset circuit 34 be used with the first reset circuit shown in FIG. 2a. Second reset circuit 34 may be used with any power-on reset circuit which requires a minimum tr to provide reliable operation.

Further note that the specific circuit implementations shown in FIGS. 2–4 are merely exemplary; numerous circuit configurations could be used to provide the functionality described herein. For example, transistors MN5 and MN6 might actually comprise two or more transistors which are stacked and connected together in series. As another example, resistance R1 in time delay circuit 48 might be provided by one or more transistors, rather than a resistor. Also note that the terms "ramps up" and "ramp-up" might also refer to a supply voltage which starts at zero and ramps down to a rated voltage; the invention is easily adaptable to use with such a system. It is only essential that there be first and second reset circuits with respective reference voltages, with the second reference voltage delayed with respect to the first such that the second reset circuit asserts a reset signal when the supply voltage's ramp-up time is such that the first reset circuit fails to assert a reset signal.

While particular embodiments of the invention have been shown and described, numerous variations and alternate embodiments will occur to those skilled in the art. Accordingly, it is intended that the invention be limited only in terms of the appended claims.

I claim:

1. A power-on reset system, comprising:
    a supply voltage VDD which ramps from 0 volts to a rated voltage,
    a first power-on reset circuit arranged to assert a first reset signal RS1 as VDD ramps from 0 volts to said rated voltage,
    a second power-on reset circuit comprising:
        a first reference voltage generator which produces a first reference voltage VR1 as VDD ramps from 0 volts to said rated voltage,
        a second reference voltage generator which produces a second reference voltage VR2 as VDD ramps from 0 volts to said rated voltage which is delayed with respect to the generation of said first reference voltage VR1, said first and second reference voltage generators arranged such that VR2>VR1 when VDD is at its rated voltage, and
        a first comparator which receives VR1 and VR2 at respective inputs and which asserts a second reset signal RS2 when VR1>VR2, and
    a logic gate which receives RS1 and RS2 at respective inputs and which asserts a reset signal RS3 when either RS1 or RS2 is asserted, said RS3 being the output of said power-on reset system.

2. The power-on reset system of claim 1, wherein said first power-on reset circuit comprises:
    a third reference voltage generator which produces a third reference voltage VR3 as VDD ramps from 0 volts to said rated voltage, and
    a voltage generator which produces a voltage V2 that tracks VDD, said first power-on reset circuit arranged to assert said first reset signal RS1 when VR3>V2,
    wherein said third reference voltage generator also serves as said first reference voltage generator such that said third reference voltage VR3 is said first reference voltage VR1.

3. The power-on reset system of claim 2, wherein said third reference voltage VR3 is arranged to track V2 over temperature such that the VDD voltage at which VR3=V2 is approximately temperature independent.

4. The power-on reset system of claim 3, wherein V2 is the voltage drop from VDD across a p-n junction which carries a first current, and VR1 and VR2 are the gate-source voltages of respective field-effect transistors which carry second and third currents, respectively.

5. A power-on reset system, comprising:
    a supply voltage VDD which ramps from 0 volts to a rated voltage,
    a first power-on reset circuit comprising:
        a first reference voltage generator which produces a first reference voltage VR1 as VDD ramps from 0 volts to said rated voltage, and
        a voltage generator which produces a voltage V2 that tracks VDD,
        said first power-on reset circuit arranged to assert a first reset signal RS1 when VR1>V2,
    a second power-on reset circuit comprising:
        a second reference voltage generator which produces a second reference voltage VR2 when VDD ramps from 0 volts to said rated voltage which is delayed with respect to the generation of said first reference voltage VR1, and a first comparator which receives VR1 and VR2 at respective inputs and which asserts a second reset signal RS2 when VR1>VR2, said first and second reference voltage generators arranged such that VR2>VR1 when VDD is at its rated voltage, and a logic gate which receives RS1 and RS2 at respective inputs and which asserts a reset signal RS3 when either RS1 or RS2 is asserted, said RS3 being the output of said power-on reset system.

6. The power-on reset system of claim 5, wherein VR1 is arranged to track V2 over temperature such that the VDD voltages at which VR1=V2 is approximately temperature independent.

7. The power-on reset system of claim 5, wherein said first reference voltage generator comprises:

a current source which provides a current I1, and a diode-connected field-effect transistor (FET) which carries I1, said first reference voltage VR1 taken at the junction of said current source and said FET.

8. The power-on reset system of claim 5, wherein said second reference voltage generator comprises:

a current source which provides a current I2, and a diode-connected field-effect transistor (FET) which carries I2, said second reference voltage VR2 taken at the junction of said current source and said FET.

9. The power-on reset system of claim 5, wherein said voltage generator comprises:

a current source which provides a current I0, and a p-n junction connected between VDD and said current source which carries I0, said voltage V2 taken at the junction of said current source and said p-n junction.

10. The power-on reset system of claim 9, wherein said p-n junction comprises a bipolar transistor having its emitter connected to VDD, its collector connected to ground, and its base connected to said current source such that the voltage at said base varies with VDD-$V_{be}$, said base voltage being said voltage V2.

11. The power-on reset system of claim 5, further comprising a second comparator which receives VR1 and V2 at respective inputs and which asserts its output when VR1>V2, the output of said comparator being said first reset signal RS1.

12. The power-on reset system of claim 5, further comprising a time delay circuit which delays the generation of VR2 with respect to the generation of VR1, said time delay circuit comprising a capacitor.

13. A power-on reset system, comprising:

a supply voltage VDD which ramps from 0 volts to a rated voltage, a first power-on reset circuit comprising:

a first reference voltage generator which produces a first reference voltage VR1 as VDD ramps from 0 volts to said rated voltage, and a voltage generator which produces a voltage V2 that tracks VDD, and a first comparator which receives VR1 and V2 at respective inputs and which asserts a first reset signal RS1 when VR1>V2, a second power-on reset circuit comprising:

a second reference voltage generator which produces a second reference voltage VR2 when VDD ramps from 0 volts to said rated voltage, a time delay circuit which delays the generation of VR2 with respect to the generation of VR1, and a second comparator which receives VR1 and VR2 at respective inputs and which asserts a second reset signal RS2 when VR1>VR2, said first and second reference voltage generators arranged such that VR2>VR1 when VDD is at its rated voltage, wherein said first voltage reference generator is arranged such that VR1 tracks V2 over temperature so that the VDD voltage at which VR1=V2 is approximately temperature independent, and a logic gate which receives RS1 and RS2 at respective inputs and which asserts a reset signal RS3 when either RS1 or RS2 is asserted, said RS3 being the output of said power-on reset system.

* * * * *

UNITED STATES PATENT AND TRADEMARK OFFICE
CERTIFICATE OF CORRECTION

PATENT NO. : 6,686,783 B1
DATED : February 3, 2004
INVENTOR(S) : Huang, Yuhong

It is certified that error appears in the above-identified patent and that said Letters Patent is hereby corrected as shown below:

Title page,
Item [75], Inventors, please add the following inventor:
-- David P. Gubbins, Limerick, Ireland (IE) --

Signed and Sealed this

Fourteenth Day of December, 2004

JON W. DUDAS
*Director of the United States Patent and Trademark Office*